United States Patent [19]

Ohyama et al.

[11] 3,961,135
[45] June 1, 1976

[54] SYNCHRONIZED DEMODULATION SYSTEM

[75] Inventors: Miyoji Ohyama; Yushi Uchida; Tateo Onodera, all of Tokyo, Japan

[73] Assignee: Nippon Electric Company, Limited, Tokyo, Japan

[22] Filed: Dec. 27, 1973

[21] Appl. No.: 429,016

[30] Foreign Application Priority Data
Dec. 29, 1972 Japan.................................. 48-1295

[52] U.S. Cl.............................. 178/7.3 R; 325/331; 178/7.3 S; 329/50
[51] Int. Cl.²...................... H04N 3/16; H03D 3/18; H04B 1/68
[58] Field of Search .............. 329/50; 325/328, 331, 325/330, 444, 49, 329, 50, 58, 136, 138; 358/23, 24; 178/7.3 R, 7.3 S, 69.5 TV

[56] References Cited
UNITED STATES PATENTS

| | | | |
|---|---|---|---|
| 2,778,933 | 1/1957 | Crist ...................................... | 329/50 |
| 2,938,071 | 5/1960 | Pritchard ........................... | 329/50 X |
| 3,023,271 | 2/1962 | Hansen .................................. | 358/23 |
| 3,144,512 | 8/1964 | McAllan et al. ...................... | 178/7.3 |
| 3,283,079 | 11/1966 | Dixon ................................. | 329/50 X |
| 3,492,580 | 1/1970 | Berman................................... | 325/49 |
| 3,502,979 | 3/1970 | Holly .................................. | 329/50 X |
| 3,674,929 | 7/1972 | Aliyama................................ | 178/7.3 |
| 3,697,685 | 10/1972 | Lunn..................................... | 178/7.3 |

*Primary Examiner*—Robert L. Griffin
*Assistant Examiner*—R. John Godfrey
*Attorney, Agent, or Firm*—Sughrue, Rothwell, Mion, Zinn and Macpeak

[57] ABSTRACT

A demodulation system for use in a vestigial sideband system of an over-modulation type including a sampler for sampling a reduced modulated carrier frequency component from a received modulated wave to be used for demodulation. A discriminator is operative to detect a vertical synchronizing signal portion in a vertical blanking period and thereupon to actuate the sampler, causing a carrier burst signal to build up. The carrier burst signal is subjected to filtering to derive a carrier wave which is supplied to a demodulator. A synchronizing pulse separator is connected to the demodulator to separate horizontal synchronizing pulses from a demodulated output, which pulses are fed back to the sampler to actuate it during the absence of the vertical synchronizing signal.

7 Claims, 5 Drawing Figures

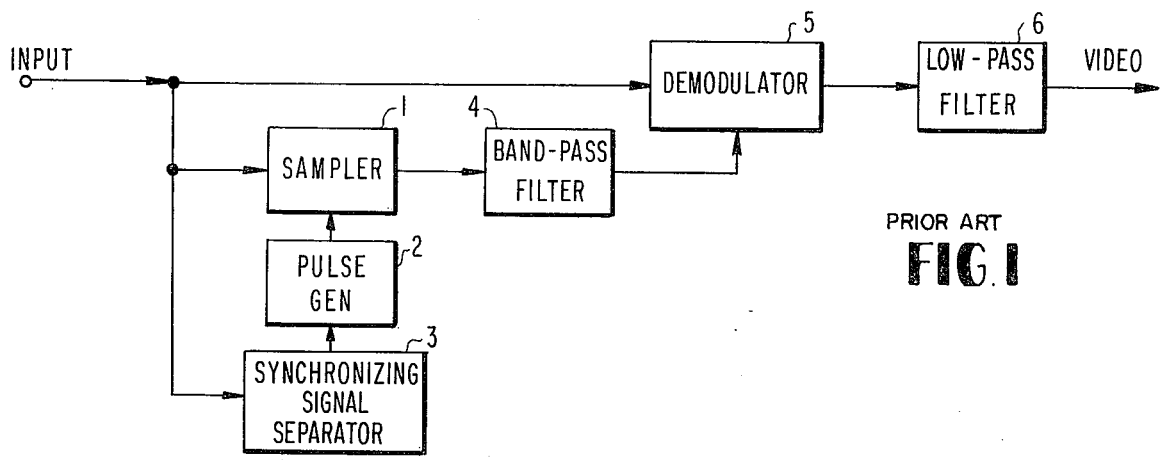
PRIOR ART
FIG. 1
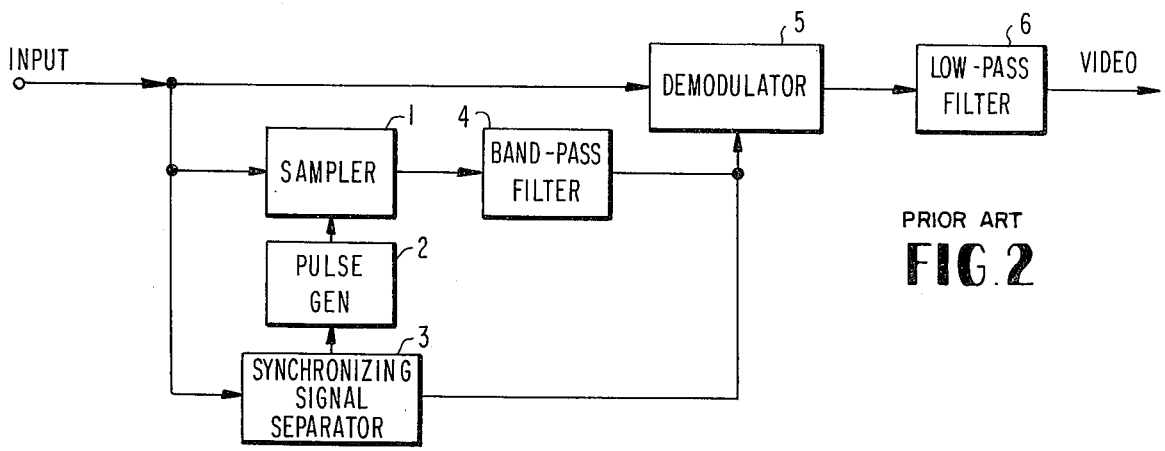
PRIOR ART
FIG. 2
FIG. 3
| MODULATED CARRIER SIG. / VIDEO SIGNAL | ECR = 0.65 | ECR = 0.5 | DC SUPPRESSED |
|---|---|---|---|
| ① WHITE SIGNAL | | | |
| ② BLACK SIGNAL | | | |
| ③ SLIT SIGNAL | | | |

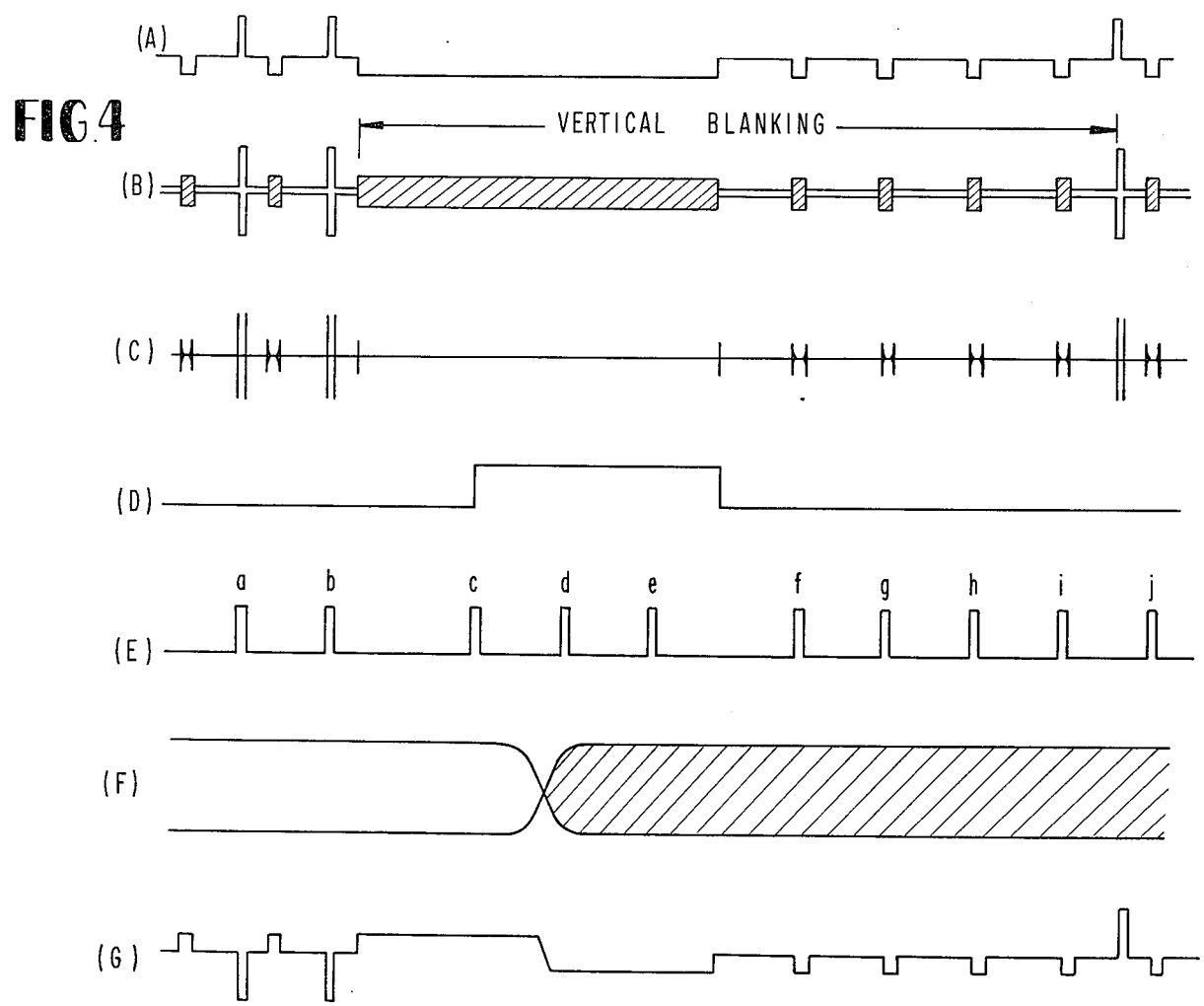
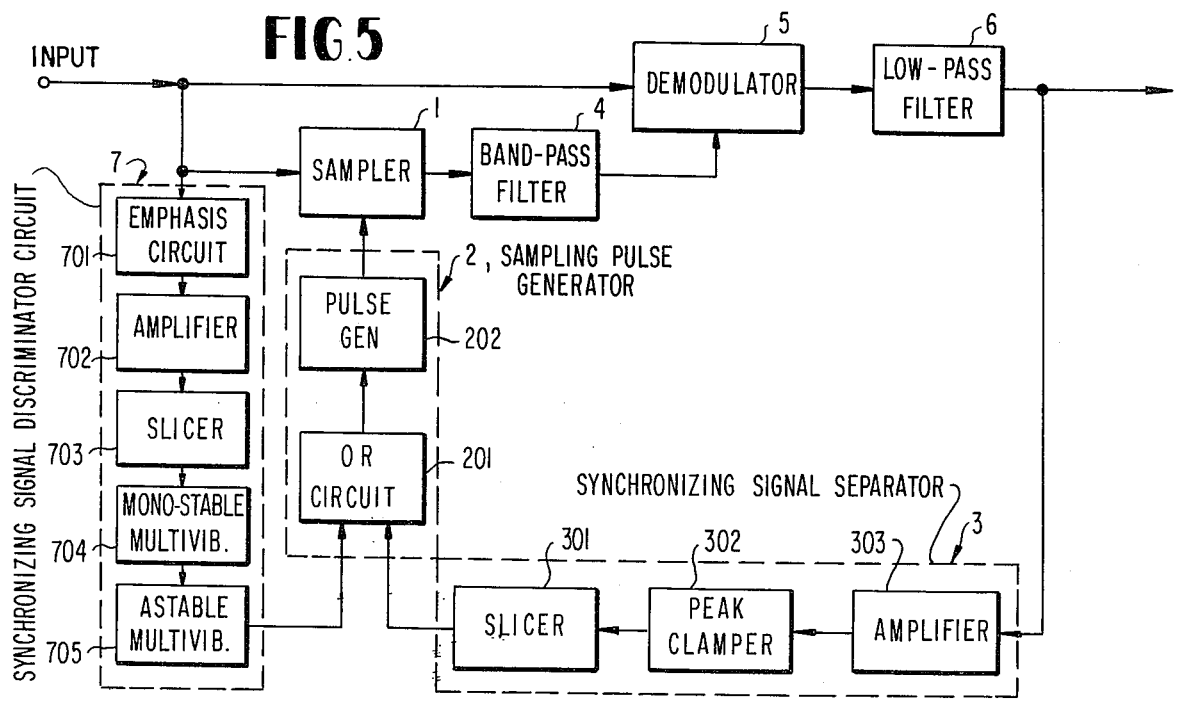

3,961,135

SYNCHRONIZED DEMODULATION SYSTEM

BACKGROUND OF THE INVENTION

The present invention relates to a system for regenerating a synchronized carrier wave for demodulation use at a receiving station, and more particularly, to a system for regenerating a carrier wave to be used for demodulation in a vestigial sideband (VSB) transmission system of an amplitude over-modulation type.

Generally, in the transmission of television video signals and the like through a coaxial cable, it is the usual practice to employ amplitude modulation requiring the narrowest sideband distribution. In this case, the degree of modulation in the amplitude modulation is set at a value higher than 100% in order to effectively utilize the load capacity of the transmission line. Furthermore, since the video signal contains very low frequency components, it is difficult to employ a single sideband (SSB) transmission system as is the case with the transmission of a telephone signal, and therefore, a vestigal sideband transmission system is employed.

Hereto, a variety of the so-called over-modulation systems have been proposed in which the degree of modulation is set at a value higher than 100% as indicated above. In achieving the over-modulation, a doublebalanced modulator is generally used. In a typical example of the over-modulation system, the balancing of a modulator with respect to a carrier wave is adjusted during a modulation process by means of a D.C. bias circuit and the excess carrier ratio (ECR) is preselected according to the transmission conditions so that ECR=0.5 ~ 0.65. Another example of the over modulation system is a carrier-suppression multi-channel television signal transmission system in which no D.C. biasing is provided for the modulator, the adjustment of the modulator balancing being achieved similarly.

At the receiving station, it is necessary to obtain a distortionless reproduction of the original modulating signal from the transmitted signals which have been over-modulated as described above at the transmitting station. To this end, it is important that a carrier wave generated for demodulation at the receiving end be synchronized both in frequency and in phase with the carrier of the modulated wave. The so-called homodyne detection system is usually employed for this purpose, in which the detection with modulation product is carried out by making use of this demodulation carrier wave. In this system, it is an essential condition to synchronize the demodulation carrier wave with the carrier wave contained in said modulated wave. In order to synchronize the demodulation carrier wave with the modulated carrier wave, a system for regenerating a carrier wave by synchronized sampling is employed. This system is based on the fact that when the carrier is subjected to over-modulation it has a phase which reverses depending upon the contents of the modulating television video signals, but the phase of the carrier wave in the portions corresponding to a synchronizing signal is not affected by the contents of the video signals. More particularly, the method employed in the system is first to determine the time positions in the transmitted modulated wave which correspond to the synchronizing signal and thus are not affected by the contents of the video signals, than to produce a carrier wave burst for each synchronizing signal by sampling the modulated carrier wave upon each synchronizing signal, and finally to derive a carrier wave for demodulation from the carrier wave burst by means of a narrow band filter whereby to eliminate a phase difference between the carrier of the modulated wave and the regenerated carrier.

Accordingly, in the aforementioned system for regenerating a carrier wave by synchronized sampling, it is an essential condition to detect, with high stability and reliability the time position of the synchronizing signal in the modulated carrier signal. However, the discrimination of the synchronizing signal is not readily achievable because the relationship between the synchronizing signal and the picture signal depends upon the modulation systems and the contents of the video signals as described above. More particularly, as we have described above, various types of over-modulation systems are available among which the modulated carrier wave signals have distinct and different waveform characteristics. For instance, even in a modulation system having a fixed ECR, the waveforms for $ECR \gtreqless 0.5$ and for $ECR=0.5$ are quite difference, and further in case of the DC elimination system, the modulated carrier wave signal shows a waveform different from that available in the fixed ECR system. Therefore, in regenerating the demodulation carrier wave, a regenerating system which effectively makes use of the characteristics of the waveform is employed.

Among the fixed ECR systems, one system is applicable only to the case of $ECR > 0.5$ while another system is equally applicable to the case of $ECR=0.5$. However, these proposed systems cannot be applied to a system in which the ECR is not fixed, that is, the DC elimination system. On also, there has been proposed a system in which separation of the synchronizing signals is possible in spite of the DC elimination involved. However, in this particular system, there is likely to be a failure to start the proper operation of the system depending upon the picture signals, in which case a proper carrier wave may not be obtained.

It is, therefore, an object of the present invention to provide an improved system for regenerating a demodulation carrier wave with a view to eliminating the above-outlined difficulties.

Another object of the present invention is to provide a system for regenerating a demodulation carrier wave, which can be activated with increased reliability in either the fixed ECR transmission system or the DC elimination transmission system, and which can provide a normal phase carrier wave in spite of the occurrence of the picture pattern variation and/or level variation.

SUMMARY OF THE INVENTION

In accordance with the teachings of this invention, there is provided an improved demodulation system for use in a vestigial sideband system of an over-modulation type including a sampler for sampling a reduced carrier frequency component from a received modulated wave to be used for demodulation. A discriminator is provided for detecting a vertical synchronizing signal portion in a vertical blanking period to actuate the sampler during the presence of such portion, causing a carrier burst signal to build up. The carrier burst signal thus obtained is subjected to filtering to derive a carrier wave which is supplied to a demodulator. A synchronizing pulse separator is connected to the demodulator to separate horizontal synchronizing pulses from a demodulated output, which pulses are fed back to the sampler to actuate it during the absence of the vertical synchronizing signal.

BRIEF DESCRIPTION OF THE DRAWING

FIGS. 1 and 2 are block diagrams showing respectively conventional systems for regenerating a synchronized demodulation carrier wave;

FIG. 3 is a table useful in explaining the manner of amplitude modulation by typical waveforms in the over-modulation transmission systems;

FIG. 4 is a waveform diagram useful in explaining the operation of the present invention; and FIG. 5 is a block diagram showing one preferred embodiment of the present invention.

DETAILED DESCRIPTION OF PREFERRED EMBODIMENTS

Now, referring first to FIG. 3, hatched portions represent waveform portions having the same phase as the carrier wave of a modulated wave and the remaining portions represent waveform portions of the opposite phase. Considering the operation of a conventional carrier wave regeneration system for use in the case of ECR>0.5, (see FIG. 1) the extremities of the synchronizing signals are always higher than the picture signal portions in either case of black and white signals as shown in the column of ECR=0.65 in FIG. 3, the carrier wave in said synchronizing signal portions being in the same phase with the carrier wave of the modulated wave as represented by the hatching. Therefore, in order to derive a normal phase carrier wave from a modulated carrier wave of ECR>0.5, it is only necessary to separate the synchronizing signal portions by means of a slicer at the receiving station. To describe this process more specifically with reference to FIG. 1, the modulated carrier wave signal received at an input terminal designated at "INPUT" is applied to a sampler 1, a synchronizing signal separator 3 and a demodulator 5. The synchronizing signal separator 3 is provided with a slicer for separating the synchronizing signal to be supplied to a sampling pulse generator 2, which in turn feeds sampling pulses to the sampler 1 in synchronism with the synchronizing signal. In the sampler 1, the modulated carrier wave signal is sampled to provide a carrier wave burst which is in turn fed to a band-pass filter 4 for generating a demodulation carrier wave, which is in turn transmitted to the demodulator 5. Since the phase difference between the demodulation carrier wave supplied from the band-pass filter 4 and the modulation carrier wave can be eliminated, the video signal delivered from the demodulator 5 through a low-pass filter 6 is a distortionless reproduction of the modulated wave. The illustrated system necessitates the presetting of ECR and it can be employed only in the case where ECR > 0.5.

FIG. 2 is a block diagram illustrating another conventional system which is equally applicable even to the case of ECR=0.5, that is, even in the case where the extremities of the synchronizing signal are not always higher than the picture signal portions as shown in the column of ECR=0.5 in FIG. 3. This system is of the type including a feedback loop from the band-pass filter 4 to the synchronizing signal separator 3, through which loop the carrier wave regenerated is fed back to the synchronizing signal separator.

More specifically, the sampling pulse generator 2 is provided with a self-running multivibrator of the external synchronization type, and this multivibrator is caused to operate for a period somewhat longer than the repetition period of the horizontal synchronizing signal to sample the modulated carrier wave signal received at the sampler 1.

In this case it is not ensured at all that during the picture signal interval in a field, a normal phase carrier wave can be obtained at the output of the band-pass filter 4. However, it should be noted that once a vertical blanking period is reached, the picture signal turns to black. As will be obvious from the row of black signals in the column of ECR=0.5 in FIG. 3, the wave of the modulated carrier wave signal is in a normal phase during the period of black signals (in this case, the vertical blanking period), so that a carrier wave burst of normal phase is supplied from the sampler 1, resulting in a carrier wave of normal phase at the output of the band-pass filter 4. With the synthesis of the modulated carrier wave signal with the normal phase carrier wave at a synthesizing transformer provided within the synchronizing signal separator 3, the reversed phase portions are attenuated at its output because of the mutually cancelling relationship, while the positive phase protions are emphasized. Accordingly, the extremities of the synchronizing signal are raised to a higher level than those of the picture signal, so that the synchronizing signal separation can be achieved by subjecting this synthesized signal to envelope detection and then causing the resulting signal to pass through a peak clamper and a slicer. Thus, after the initial vertical blanking period has elapsed, the continuous and normal synchronizing signal detection can be achieved. However, this system, still has a problem relating to the process for leading to a stable state, although once the system has been satisfactorily started a stable operation can be realized thereafter. More particularly, considering a television-telephone i.e. picture phone or video phone signal waveform such as that shown in FIG. 4(A), which is characterized by the absence of serrations in the vertical synchronizing pulse during the vertical blanking period also of the and equalizing pulses present in the ordinary color broadcasting television signals the regeneration of the carrier wave would be interrupted unless sampling is performed also during this vertical blanking period. To this end, the vertical synchronizing pulse is detected for the purpose of driving the self-running multivibrator whereby the sampling is performed for each simulated horizontal synchronizing pulse. However, in case where the system has been put into operation during a picture signal interval in a field, even when it comes to a vertical blanking period the vertical synchronizing pulse cannot be detected because a carrier wave of reversed phase has built up. Thus, it is likely that erroneous sampling might be caused by the self-running multi-vibrator, resulting in a failure to start the system in a satisfactory manner.

Referring to FIG. 5, there is shown a carrier regeneration system according to one prepared embodiment of the present invention, which is characterized in that there is provided with a synchronizing signal discriminator circuit 7 where the vertical synchronizing signal is separated from the modulated carrier wave signal rather than the regenerated carrier wave. In accordance with the provision of the synchronizing signal discriminator circuit 7, the sampling pulse generator 2 is provided with an OR circuit 201 for producing the logical sum of the outputs from the synchronizing signal discriminator 7 and the synchronizing signal separator 3.

As described above, in addition to the feedback loop including the synchronizing signal separator 3, another loop for detecting a vertical synchronizing pulse is provided in which in response to the arrival of the initial vertical blanking interval the vertical synchronizing pulse can be detected at once independently of the regenerated carrier wave. Therefore, if a pulse generator 202 in the sampling pulse generator 2 is actuated by the output of the synchronizing signal discriminator circuit 7, then in the sampler 1 is sampled the normal phase carrier wave within the vertical synchronizing pulse in the modulated carrier wave signal. Accordingly, at the output of the band-pass filter 4 the normal phase carrier wave is obtained.

After the positive phase carrier wave has built up, the demodulator 5 can perform proper synchronized detection to regenerate a video signal at the output of the low-pass filter 6. The regenerated video signal is applied to the synchronizing signal separator 3, in which after the video signal has been amplified by an amplifier 303, the synchronizing pulses are separated by means of a peak clamper 302 and a slicer 301. For each separated synchronizing pulse, a sampling pulse is generated in the sampling pulse generator 2, and thereby stabilized sampling is made possible. In other words, according to this particular system, since the vertical synchronizing signal is detected for purpose without feeding back the regenerated carrier wave appearing at the output of the band-pass filter 4, it is possible to ensure a proper starting, and the separation of the synchronizing signal from the normal phase carrier wave obtained after starting, can be performed with stability in accordance with the prior art technique.

Now the operation of one preferred embodiment of the synchronizing signal discriminator circuit 7 as illustrated in FIG. 5, will be described with reference to the television-telephone signal waveforms in FIG. 4. It is to be noted that FIG. 4 shows the case where a slit signal is given as the video signal in the television-telephone signal.

With reference to FIG. 4, if a carrier wave is subjected to double-balanced modulation with a signal waveform (A) without applying a D.C. bias (a D.C. elimination system), a modulated carrier wave signal as shown at (B) is obtained. In this figure also, the hatched portions represent a normal phase carrier wave, while the remaining portions represent a reversed phase carrier wave, as is the same with FIG. 3. When the modulated carrier wave signal (B) is received by the synchronizing signal discriminator circuit 7 as shown in FIG. 5, this signal is first applied to an emphasis circuit 701. When they are passed through this emphasis circuit, the frequency components in the vicinity of the carrier wave frequency are suppressed, and thereby a waveform as shown in FIG. 4(C) is obtained. This waveform is equivalent to a waveform which would be obtained by suppressing lower frequency components in the video signal shown in FIG. 4(A) and thereafter subjecting the resultant signal to double-balanced modulation. More particularly, in the horizontal synchronizing signal portion a trigger pulse can be always obtained, while in the vertical synchronizing signal portion during the vertical blanking period always the trigger pulse disappears for a period longer than the interval between the horizontal synchronizing signals.

In order to make use of this phenomenon, after the waveform in FIG. 4(C) has been amplified by an amplifier 702, the waveform is used to drive a mono-stable multivibrator 704 through a slicer 703. Since the mono-stable multivibrator 704 has a pulse width somewhat longer than the interval between the horizontal synchronizing signals, a waveform as shown in FIG. 4(D) is obtained at the output of the mono-stable multivibrator 704, and this signal is applied to an astable multivibrator 705 may be the sampling pulse generator 2 to thereby generate sampling pulses at the time positions of pulses $c \sim e$ in FIG. 4(E). Sampling the waveform of FIG. 4(B) upon each of the sampling pulses $c \sim e$ causes a normal phase carrier wave to begin to build up as shown by the waveform in FIG. 4(F), and once the normal phase carrier wave has been grown, the demodulator 5 performs proper synchronized detection, so that a waveform as shown in FIG. 4(G) can be obtained at the output of the low-pass filter 6. It is easy to separate the synchronizing pulses from this waveform by means of the synchronizing signal separator 3. The pulses $f, g, h, \ldots$ in FIG. 4(E) are generated in the pulse generator 2, and thus it is possible to continuously obtain the normal phase carrier wave in a stable manner by carrying out the normal sampling.

As has been described above, the present invention enables the synchronized sampling, in a stable manner irrespective of the type of a transmission system and even in spite of the variation of the picture signal as well as the variation of the transmission level. Accordingly, it will be appreciated that the present invention provides improvements in the demodulation-detection technique employed at a receiving station in the VSB transmission system for reception of television signals and the like.

What is claimed is:

1. In a synchronized demodulation system including means for receiving a modulated carrier wave modulated by a composite signal containing first and second synchronizing signals having different time periods, said second synchronizing signal containing substantially no frequency components of said first synchronizing signal, the excess carrier ratio of said modulated carrier wave being smaller than unity but not smaller than 0.5, means for demodulating said modulated carrier wave by means of an internal carrier wave synchronized with the carrier rrequency component of said modulated carrier wave, thereby to regenerate said composite signal, means for separating said first synchronizing signal from said regenerated composite signal, means for generating sampling pulses upon reception of said separated first synchronizing signal, means for sampling said modulated carrier wave by said sampling pulses to derive a carrier burst signal, and means for selecting the carrier frequency component from said carrier burst signal to deliver said internal carrier wave for demodulation in said demodulating means, the improvement comprising:

means responsive to said modulated carrier wave for generating a gate pulse in the time period of said second synchronizing signal;

means responsive to said gate pulse for generating self-running synchronizing pulses with a repetition rate substantially equal to that of said first synchronizing signal during the time period of said gate pulse; and means responsive to said self-running synchronzing signal for generating addition sampling pulses to be applied to said sampling means during the time period of said gate pulse.

2. The demodulation system as set forth in claim 1, in which said additional sampling pulse generating means includes:
- an OR circuit having two inputs connected to the outputs of said first synchronizing signal separating means and of said self-running synchronizing pulse generating means; and
- a pulse generator responsive to the output of said OR circuit for generating said additional sampling pulses.

3. The demodulation system as set forth in claim 1, in which said carrier frequency component selecting means includes a band-pass filter for filtering the sampled output.

4. The demodulation system as set forth in clailm 1, in which said gate pulse generating means includes:
- suppressor means for suppressing the frequency components of said received modulated wave in the vicinity of said carrier frequency; a slicer connected to the output of said suppressor means; and a mono-stable multivibrator responsive to the output of said slicer.

5. The demodulation system as set forth in claim 4, in which said self-running synchronizing pulses generating means includes:
- an astable multivibrator responsive to the output of said mono-stable multivibrator.

6. The demodulation system as set forth in claim 4, in which said mono-stable multivibrator
- has an output pulse, the width of which is somewhat longer than the time interval between said first synchronizing signals.

7. A demodulation system for use in a transmission system of the character in which a carrier wave is subjected to over-modulation with a composite signal containing first and second synchronizing signals, said demodulation system comprising:
- discriminator means for discriminating a first synchronizing signal portion from a second synchronizing signal portion in a received modulated wave;
- sampler means for sampling said received modulated wave during the presence of said first synchronizing signal portion in order to derive said carrier wave;
- demodulator means for demodulating said received modulated signal with said carrier wave; and
- separator means for separating said second synchronizing signal from said received modulated wave, said separated second synchronizing signal being fed back to said sampler means to actuate it during the absence of said first synchronizing signal, said separator means including a peak clamper responsive to the output of said demodulator means and a slicer responsive to the output of said peak clamper.

* * * * *

UNITED STATES PATENT AND TRADEMARK OFFICE
CERTIFICATE OF CORRECTION

PATENT NO. : 3,961,135
DATED : June 1, 1976
INVENTOR(S) : Miyoji OHYAMA et al

Page 1 of 3

It is certified that error appears in the above-identified patent and that said Letters Patent are hereby corrected as shown below:

Column 1, line 23 - delete [Hereto] and insert -- Heretofore -- line 27 - delete [blebalanced] and insert -- ble-balanced -- line 56 - after "over-modulation" insert a comma line 65 - delete [than] and insert -- then --

Column 2, line 2 - after "filter" insert a comma line 8 - after "reliability" insert a comma line 21 - delete [difference] and insert -- different -- line 32 - delete [On also] and insert -- Also --

Column 3, line 23 - after "0.5" delete comma line 23 - after "(see FIG. 1)" insert a comma Column 4, line 10 - between "the" and "wave" insert -- carrier -- line 11 - delete [of] and insert -- in -- line 11 - after "modulated" delete [carrier]

line 11 - after "is" delete [in] and insert -- of --

UNITED STATES PATENT AND TRADEMARK OFFICE
CERTIFICATE OF CORRECTION

PATENT NO. : 3,961,135
DATED : June 1, 1976
INVENTOR(S) : Miyoji OHYAMA et al

It is certified that error appears in the above-identified patent and that said Letters Patent are hereby corrected as shown below:

Column 4, line 31 - after "system" delete the comma line 39 - after "period" insert -- and -- line 39 - after "of the" delete [and]

line 40 - delete [color]

line 41 - delete [signals] and insert -- signal, -- line 57 - delete [prepared] and insert -- preferred --

Column 5, line 7 - after "wave" insert -- to provide a quasi-synchronizing signal at the output of a pulse generator 202 -- line 7 - delete [a] and insert -- the -- line 27 - after "for" insert -- sampling --

Column 6, line 8 - delete [may be] and insert -- for driving -- line 14 - delete [been grown] and insert -- built up -- line 25 - after "sampling" delete the comma

UNITED STATES PATENT AND TRADEMARK OFFICE
CERTIFICATE OF CORRECTION

PATENT NO. : 3,961,135  Page 3 of 3
DATED : June 1, 1976
INVENTOR(S) : Miyoji OHYAMA et al It is certified that error appears in the above-identified patent and that said Letters Patent are hereby corrected as shown below:

Column 6, line 45 - delete [rrequency] and insert -- frequency --

Column 7, line 16 - delete [clailm] and insert -- claim --

Signed and Sealed this

Fourteenth Day of September 1976

[SEAL]

Attest:

RUTH C. MASON
Attesting Officer

C. MARSHALL DANN
Commissioner of Patents and Trademarks